United States Patent [19]
Kovacs

[11] Patent Number: 5,524,042
[45] Date of Patent: Jun. 4, 1996

[54] EXIT WINDOW FOR X-RAY LITHOGRAPHY BEAMLINE

[75] Inventor: Stephen Kovacs, Stony Brook, N.Y.

[73] Assignee: Northrop Grumman Corporation, Los Angeles, Calif.

[21] Appl. No.: 356,493

[22] Filed: Dec. 15, 1994

[51] Int. Cl.⁶ .................................................. G21K 1/00
[52] U.S. Cl. ................................. 378/161; 378/34
[58] Field of Search ..................... 378/161, 34, 119, 378/121

[56] References Cited

U.S. PATENT DOCUMENTS

| | | | |
|---|---|---|---|
| 4,852,113 | 7/1989 | Ikeda et al. | 378/34 |
| 4,899,354 | 2/1990 | Reinhold | 378/34 |
| 5,001,437 | 3/1991 | Miyata et al. | 328/237 |
| 5,031,199 | 7/1991 | Cole, III et al. | 378/34 |
| 5,073,913 | 12/1991 | Martin | 378/34 |
| 5,159,621 | 10/1992 | Watanabe et al. | 378/161 |

OTHER PUBLICATIONS

"Webster's New World Dictionary", pp. 86–87.
Brodsky (1988) "The Mechanical Design of Thin Beryllium Windows for Synchrotron Radiation," *Nuclear Instruments and Methods in Physics Research* A266:358–361.
Kovacs, et al. (1990) "Optimizing a synchrotron based X-ray lithography system for IC manufacturing," *SPIE* 1263:140–150, 7–8 Mar. 1990.
Kovacs, et al. (1991) "System design considerations for a production grade ESR-based X-ray lithography beamline," *SPIE* 1465:88–99, 6–7 Mar. 1991.

Primary Examiner—David P. Porta
Assistant Examiner—Don Wong
Attorney, Agent, or Firm—Terry J. Anderson; Karl J. Hoch, Jr.

[57] ABSTRACT

An exit window for an X-ray lithography beamline having a shape and thickness such that the exit window can withstand a pressure differential of at least 14.7 psi and allows an X-ray beam as passed through the window to have X-rays above and below a desired energy band substantially attenuated. The exit window includes a thin material having a window section disposed within an opening of a frame and a peripheral section which is integral with the window section and extends within the frame. The window section has a shape that is substantially concave along its width, substantially linear along its length and tapers to a flat surface near the periphery of the opening. A method of scanning the X-ray beam through a stationary exit window and onto an exposure field on a wafer is also disclosed.

19 Claims, 5 Drawing Sheets

EXIT WINDOW FOR X-RAY LITHOGRAPHY BEAMLINE

BACKGROUND OF THE INVENTION

1. Field of the Invention

The present invention relates generally to an exit window for an X-ray lithography beamline, and more particularly, to a thin beryllium exit window having a shape and thickness such that it can withstand a pressure differential of at least 14.7 psi and has X-rays above and below a desired energy band substantially attenuated.

2. Description of the Prior Art

Since the first planar transistor was fabricated in the late 1950's the number of transistors on integrated circuits have doubled every year. The driving force behind this growth has been the ever increasing demand for higher speed communication in ever increasing chip sizes. The continuously increasing production and resolution requirements for manufacturing semiconductor devices will lead to performing microlithographic operations on 8–10 inch diameter wafers producing lithographed lines with 0.25 micron resolution in the mid 1990s. To meet the demands, these operations should be performed at a high production rate level, i.e., 30 to 60 wafers per hour per beamline. Although electron beam and focused ion beam techniques can meet critical dimension requirements, their low production rates make them unsuitable for high rate production. X-ray lithography was successfully utilized in 1989 to demonstrate the fabrication of functional NMOS and CMOS circuits with fully scaled 0.5 micron ground rules. The utilization of an electron storage ring (ESR) as the X-ray source, with its highly collimated X-ray flux at high intensity levels that can be delivered to many ports, has the necessary properties to satisfy both resolution and production volume needs of the future.

The major subunits of an ESR based X-ray lithography system (XLS) include a preaccelerator, beam transport line, electron storage ring (synchrotron), lithography beamlines and exposure stations (aligner/stepper), where the actual lithography takes place. The lithography beamline performs a specialized role in the lithography system in that it connects the source to the lithography station. One basic ESR XLS performance requirement is to support 0.25 micron resolution lithography with the given stepper. One of the resolution related optical parameters is the lithography exposure window. The elements that form the exposure window in the beamline and the stepper include mirrors, filters and an exit window. The function of the exit window is to separate the beamline from the stepper (lithography chamber) and contribute to the formation of the exposure window. The lithography beamline connects the synchrotron to the exposure chamber. The beamline operates at an ultra high vacuum (UHV) while the exposure chamber operates at atmospheric pressure. In order to ensure the vacuum integrity of the beamline, the exit window must be able to withstand this pressure differential. The window material must also be transmissive to a desirable beam energy. This means the exit window material must behave as a high pass filter by providing minimum attenuation in that portion of the spectrum which is required for lithography, i.e. 800–1800 eV range, and maximum cutoff in the low energy interval of radiation. This absorption can be minimized with properly selected window materials and optimized material thickness. Beryllium is one of the possible exit window materials. The ideal window will have minimum power absorption in the exposure spectrum range and, therefore, minimum thickness. However, this minimum thickness will not be able to withhold the 1 $Kg/cm^2$ pressure differential. It is clear that the power transmission and the mechanical strength of the window are competing factors that must be optimized.

One basic future production lithography requirement dictates the manufacture of larger chip sizes with horizontal and vertical dimensions of 50 mm by 25 mm or larger. This defines the area to be illuminated with X-rays. The most practical way currently known in the prior art is to generate a "flat" (a few mm in the vertical dimension) X-ray beam with the required width (50 mm or wider) and to scan this beam over the field or move the wafer relative to the beam. This scanning type exit window is slightly larger than the beam cross section and it is synchronously moved with the scanning beam. The scanning exit window can be comprised of a flat beryllium sheet 4 mm×60 mm and 18 microns thick and will withstand the required pressure differential as well as be transmissive to the desired beam energy. However, the scanning exit window is a complicated subsystem of the beamline and makes the fabrication of the beamline expensive and its operation difficult. In addition, scanning the beam introduces difficulties in the optics of the lithography beamline including mechanical movement that generates uncompensated vibration. Further disadvantages include fatigue of connecting bellows which may trigger a major vacuum accident, higher thermal density load requiring additional cooling and an additional control system is required. Thus, there is a need to develop a stationary exit window that meets the requirements of pressure differential and beam energy transmission.

SUMMARY OF THE INVENTION

The present invention is directed to an exit window for an X-ray lithography beamline having a shape and a thickness such that the exit window can withstand a pressure differential of at least 14.7 psi between the ultra high vacuum of the X-ray lithography beamline and the pressure within the exposure chamber. In addition, the shape and thickness of the exit window are optimized so that the window is transmissive to X-rays within a desired energy band, typically between 800 eV and 1800 eV. The present invention allows the exit window to have an opening which is approximately equal to an exposure field on a wafer in the exposure chamber. In contrast to prior art exit windows which require a scanning exit window, the present invention allows a stationary exit window to be utilized.

The exit window of the present invention includes a frame for securely mounting the exit window. The frame has an opening that can be equal to the size of an exposure field on the wafer. The exit window is comprised of a thin material having a window section disposed within the opening of the frame and a peripheral section which is integral with the window section and extends within the frame. The window section is exposed to the X-ray beam emitted from the beamline and has a shape that is substantially concave along its width and substantially linear along its length. The window section tapers to a flat surface at a periphery of the opening. This shape and a desired thickness allow the exit window of the present invention to withstand a pressure differential of at least one atmosphere and allow a desired energy band of X-rays to pass through the exit window. The exit window is preferably formed of beryllium having a thickness between 16 and 25 microns. By utilizing an exit window having a cross section that can be equal to the exposure field on the wafer, a stationary exit window can be used, which has a main advantage in that no mechanical movement is required. Alternatively, the cross section of the window can be made slightly larger than the cross section of the X-ray emitted from the beamline, in which case, the exit window can be synchronously scanned with the X-ray beam.

The frame consists of first and second members each having an opening that is preferably rectangular and approximately equal to the exposure field on the wafer. Each member is tube shaped having a rectangular side view and an integral rectangular shoulder at one end thereof. The peripheral section of the window at the periphery of the opening extends between the first and second frame members. The exit window and frame members are held in place by two pins located on opposite ends of the shoulders of the first and second frame members. A vacuum seal is disposed within the first frame member completely surrounding the opening and abutting a part of the thin material sandwiched between the first and second frame members.

The present invention is also directed to a method of scanning the X-ray beam emitted from the beamline onto the exposure field of the wafer. The first step is to position a stationary exit window having an opening that is approximately equal to the exposure field between the beamline and the wafer. The exit window has a shape and thickness that can withstand a pressure differential of at least 14.7 psi and is transmissive to the desirable energy band. Next, a vacuum is created within the beamline such that there is a pressure differential of at least 14.7 psi between the beamline and an exposure chamber containing the wafer. The X-ray beam is scanned up and down between first and second positions such that the X-ray beam passes through the exit window and is scanned over the entire exposure field on the wafer. The X-ray beam as passed through the exit window has X-rays above and below a desire energy band substantially attenuated.

DETAILED DESCRIPTION OF THE INVENTION

The continuously increasing production and resolution requirements for manufacturing semiconductor devices has led to the development of an electron storage ring (ESR) based X-ray lithography system (XLS). The major subunits of an ESR based XLS include a preaccelerator, beam transport line, electron storage ring (synchrotron), lithography beamlines and exposure stations (aligner/stepper). A typical beamline for an XLS is described in U.S. Pat. No. 5,031,199 the specification of which is hereby incorporated by reference thereto. One basic ESR XLS performance requirement is to support 0.25–0.10 micron lithography resolution with a given stepper. One of the resolution related optical parameters is the lithography exposure window. The elements that form the exposure window in the beamline and the stepper include mirrors, filters and an exit window.

One of the functions of the exit window is to separate the beamline from the stepper (lithography chamber) and contribute to the formation of the exposure window. The beamline connects the synchrotron to the exposure chamber where the actual lithography takes place. The beamline operates at an ultra high vacuum (UHV) while the exposure chamber operates at about 760 mm Hg (atmospheric pressure). In order to ensure the vacuum integrity of the beamline, the exit window must be able to withstand at least this pressure differential. In addition, the material of the window must be transmissive to that portion of the spectrum which is required for lithography (between 800 eV and 1800 eV) and substantially attenuate X-rays above and below the desired energy band. Moreover, the effects on the X-ray beam power uniformity of the X-ray beam passing through the exit window must be considered. A high performance ESR based XLS requires that the power uniformity in the beam be 95% or better.

Figure 1:
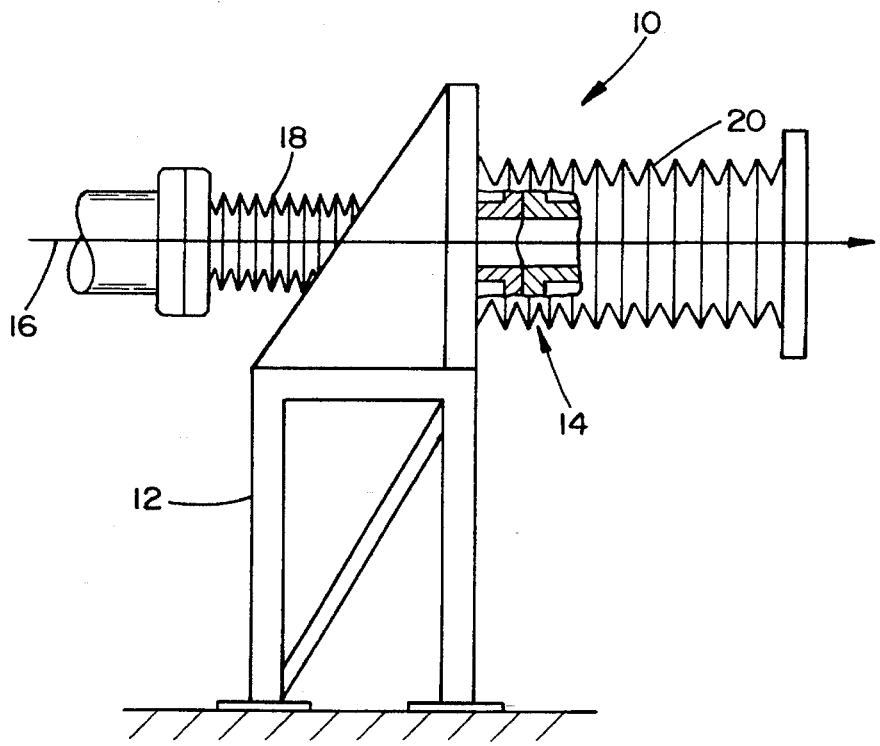
FIG. 1 is a schematic drawing in partial cross-section of an exit window assembly in accordance with the present invention.

The exit window of the present invention achieves all of the above requirements. Referring now to FIG. 1, there is shown a stationary exit window assembly 10 which can be utilized in accordance with the present invention. The assembly 10 includes a support structure 12 to support exit window 14. An X-ray beam 16 travels in the direction shown, from the beamline (not shown) through exit window 14 and finally to the stepper or exposure chamber (not shown). Bellows 18 are provided to maintain the pressure in the beamline at an ultra high vacuum and bellows 20 are provided to maintain the pressure in the exposure chamber at atmospheric pressure.

Figure 2:
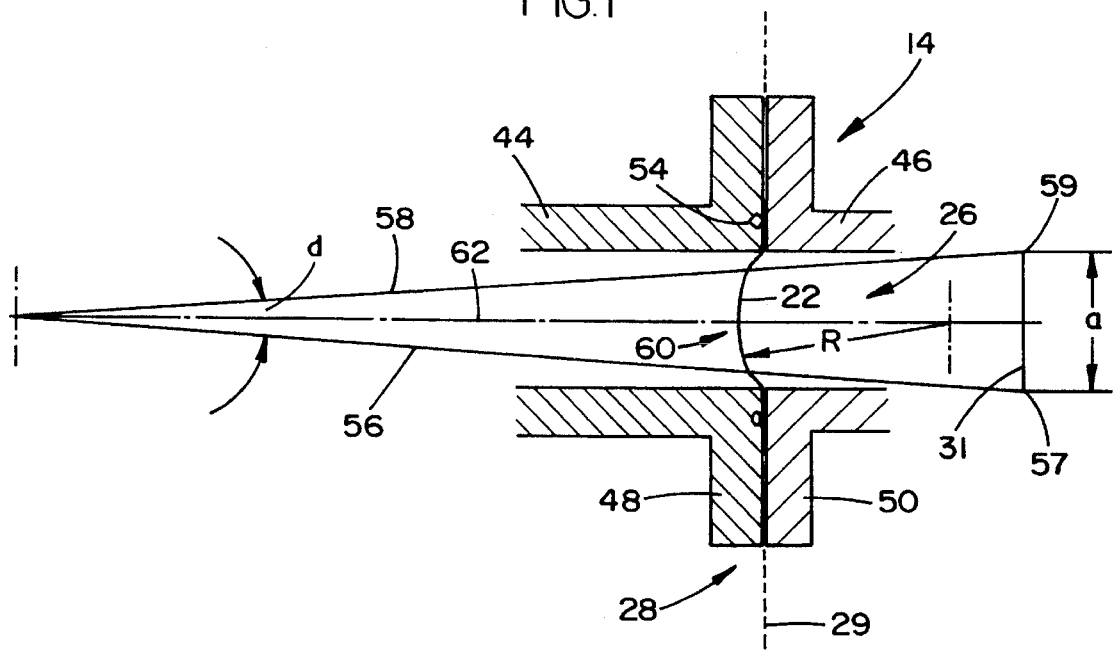
FIG. 2 is a cross-sectional view of the exit window of FIG. 1.
Figure 3A:
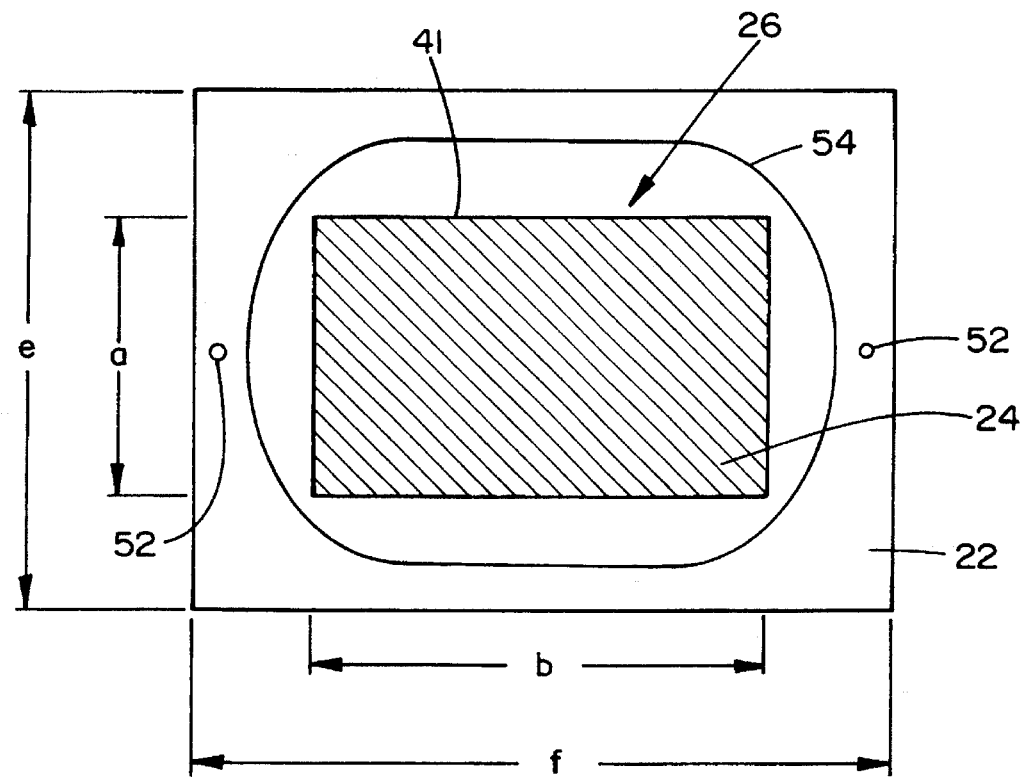
FIG. 3(a) is a front view of the exit window of FIG. 1.
Figure 3B:
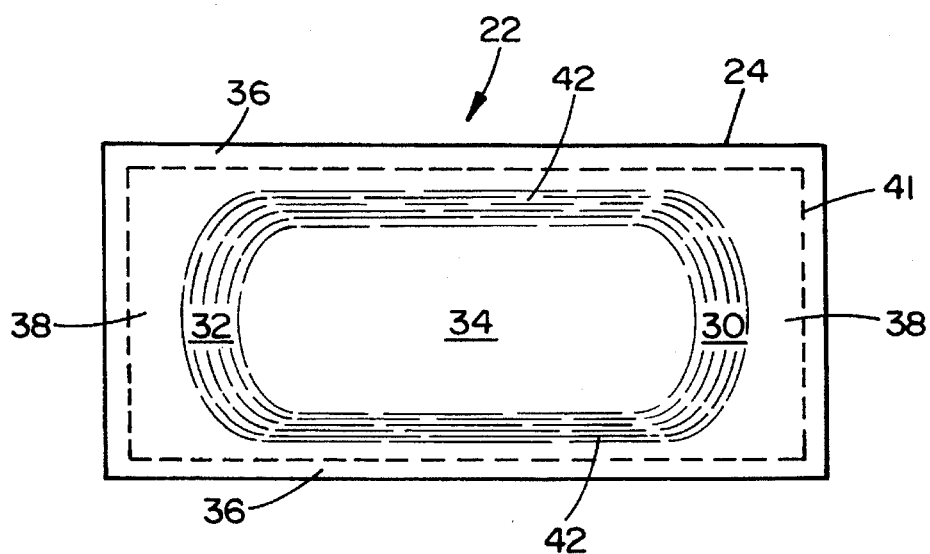
FIG. 3(b) is a detailed front view of the exit window of FIG. 3(a).
Figure 4:
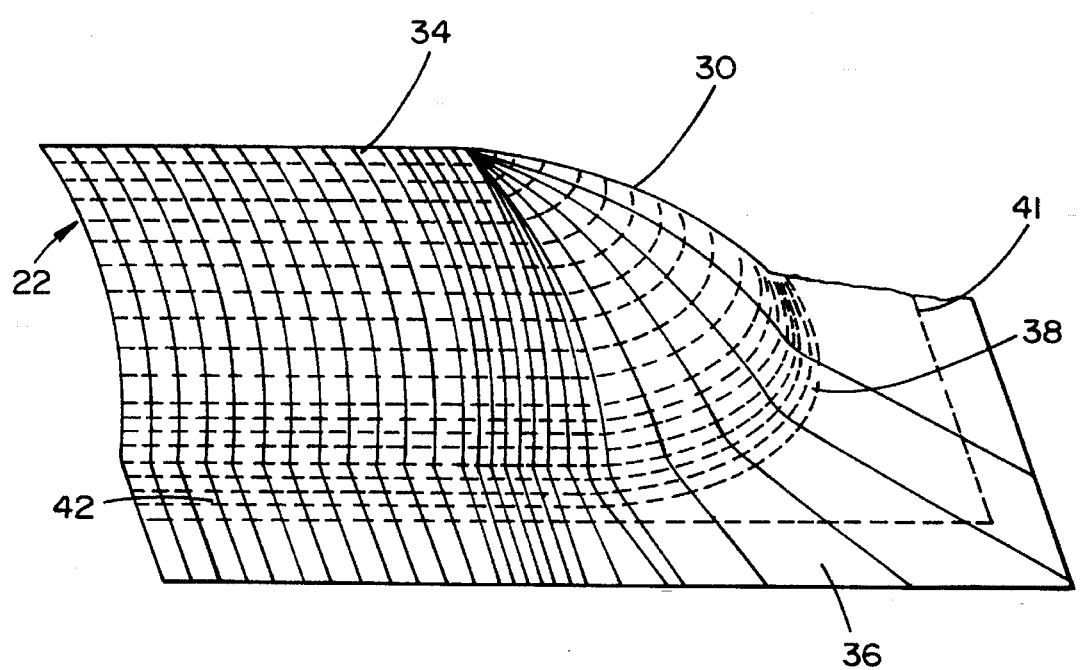
FIG. 4 is a perspective view of one-quarter of the exit window of FIG. 3(b).

Referring now to FIGS. 2, 3(a), 3(b) and 4 there is shown respective cross-sectional, front, detailed front, and perspective views of the exit window 14 of the present invention. The window 14 includes a thin material 22 having a window section 24 disposed within an opening 26 of a frame 28. The dotted lines 29 represent the separation between the beamline and the exposure chamber. As shown in FIG. 3(a), the width "a" represents the width of an exposure field 31 on a wafer (not shown) in the exposure chamber as well as the width of opening 26. As shown in the full front view of the window in FIG. 3(b), the window section 24 includes first and second end sections 30, 32 and a middle section 34 disposed between the first and second end sections 30, 32. The window 14 also includes a flat rectangular peripheral section 36 which is integral with each of sections 30, 32 and 34 of window section 24 and extends within frame 28. As shown in FIG. 3(b) and the one-quarter perspective view of FIG. 4, the first and second end sections 30, 32 have a substantially concave shape that tapers to a flat shape 38 near a periphery 41 of the opening 26. The shape of the end sections 30, 32 can be analogized to a dome that is cut in two having its upper lip pulled back. The middle section 34 has a shape that is substantially concave along its width and linear along its length and tapering to flat surfaces 42 near the periphery 41 of the opening 26. As will be described below, middle section 34 has a substantially constant surface radius R which is preferably as large as possible so as to minimize the effects on beam power uniformity of the X-ray beam passing through exit window 14.

AS shown in FIG. 2, frame 28 is provided to securely fasten the thin material 22 in place. The frame 28 consists of first and second frame members 44, 46 each having an opening that is preferably rectangular and equal to the exposure field on the wafer. Each of members 44, 46 is tube shaped with a rectangular cross section and integral with rectangular shoulders 48, 50 respectively which extend perpendicularly from one end of each of members 44, 46. The members 44, 46 are held together, and the thin material 22 is secured by pins 52 on opposite sides of each of shoulders 48, 50 as shown in FIG. 3(*a*). In order to seal the UHV of the beamline from the atmospheric pressure in the exposure chamber a seal 54 is positioned within the member 44 and abuts the thin material 22 between the members 44, 46. The seal 54 completely surrounds the opening 26 and can be formed of aluminum. Although the frame 28 and opening 26 have been described as having rectangular shapes, it should be understood by those skilled in the art that other shapes, such as spherical and ellipsoidal can be utilized. However the rectangular shape is preferred because spherical and ellipsoid shapes require thicker exit window materials which increase the absorption of radiation and therefore decreases the radiation intensity passing through the window.

Figure 5:
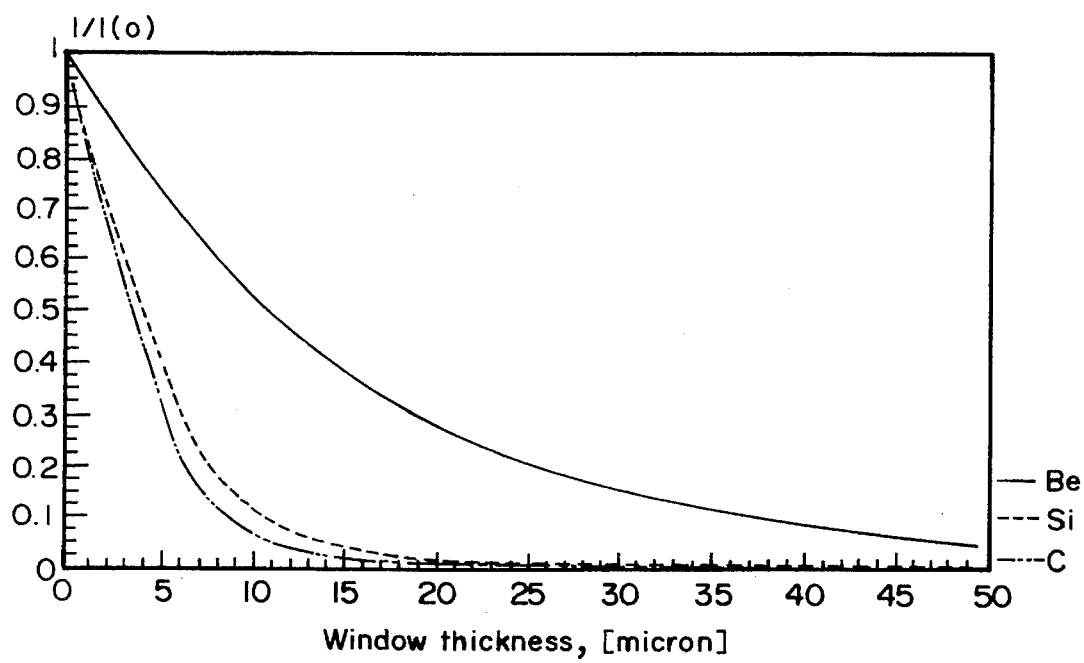
FIG. 5 is a graph of the relative beam transmission as a function of window thickness for three different materials utilized in the exit window of the present invention.

By providing an exit window 14 having the shape described above, the present invention allows the window to withstand the 14.7 psi pressure differential between the beamline and the exposure chamber and the thin material to be thin enough to allow the desired energy spectrum through the window while substantially attenuating the energy band above and below the desired range. The exit window 14 can withstand a pressure differential of up to 44.1 psi. A preferred material for the thin material 22 of exit window 14 is beryllium having a thickness between 16–25 microns. Other materials that can be used for the thin material 22 include carbon (diamond), silicon, silicon carbide, and silicon nitride having a thickness between 25–35 microns. Referring now to FIG. 5, there is shown a graph of the relative beam transmission as a function of exit window thickness for three different exit window materials. As shown in FIG. 5, beryllium is preferred since the silicon and carbon exit windows yield lower radiation transmissions and require more intensive cooling and which leads to a lower production throughput.

Figure 6:
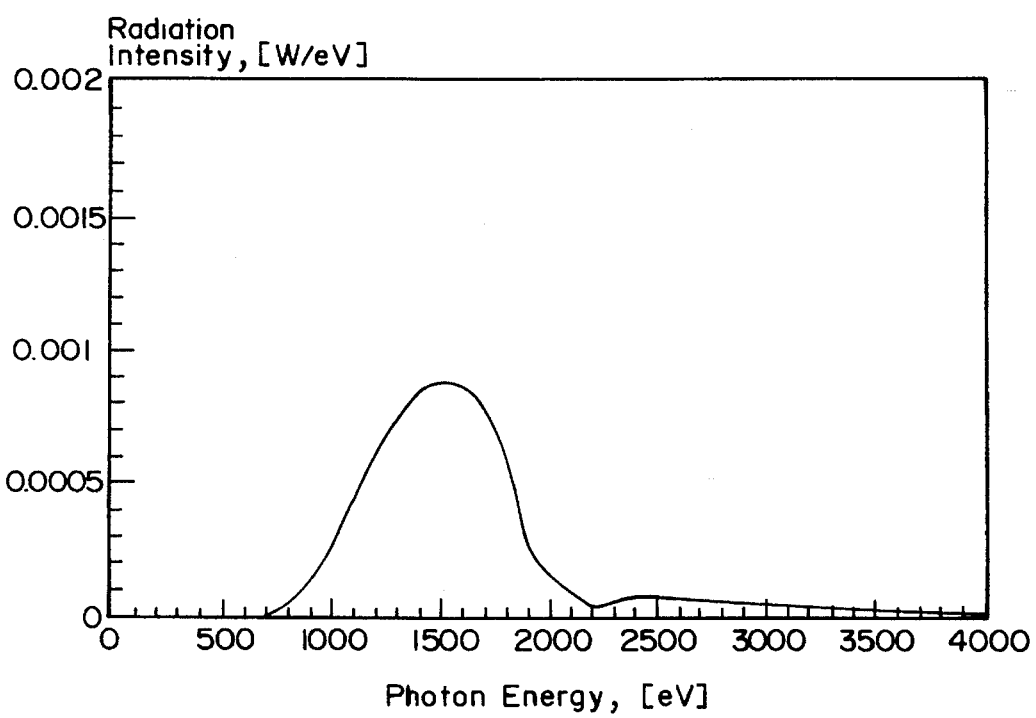
FIG. 6 is a graph of the radiation intensity of an X-ray lithography beamline X-ray emitted through the exit window of the present invention.

Referring now to FIG. 6, there is shown a graph of the radiation intensity of the X-ray beam emitted through the exit window 14 of the present invention. The exit window had a thickness of 18 microns. As seen in FIG. 6, the exit window of the present invention allows the desired energy spectrum (800–1800 eV) through the window while substantially attenuating the energy band above and below the desired energy band.

In a production X-ray lithography beamline application the exit window size is dictated by the size of the exposure field (chip size). A performance requirement for ESR based XLS is that the exposure field (chip sizes) on a wafer must be 25 mm×50 mm or larger with wafer diameters of 200 mm. By providing the exit window 14 having the shape described above, the present invention allows the exit window to meet this requirement by allowing the width "a" of opening 26 to be 25 mm or larger and the length "b" of opening 26 to be 50 mm or larger. In this embodiment, the width "e" of the thin material 22 can be 42 mm and the length "f" of the thin material 22 can be 120 mm. Thus, the present invention provides an exit window 14 that can support a stationary exit window. The cross-section of the X-ray beam scanned over the exit window is typically a few mm in the vertical dimension and 50 mm or wider. In order to fully illuminate the exposure field this beam is scanned over the entire vertical dimension of 25 mm or a stationary beam is used and the target (mask and wafer) is moved relative to the stationary beam. In either case, the present invention allows the exit window to be stationary. This is in marked contrast to prior art exit windows that require a synchronously scanning exit window to be scanned along with the X-ray beam. The stationary exit window of the present invention has a simpler design and operation over scanning exit windows which contribute to a longer lifetime. The stationary window has the advantage that no mechanical movement is required. In addition, no control system is required and the heat load is distributed on a larger surface area.

The present invention is also directed to a method of scanning the X-ray beam emitted from the X-ray lithography beamline onto the exposure field 31 of a wafer (not shown). The method includes the step of positioning a stationary exit window having an opening 26 approximately equal to the exposure field 31 between the beamline and the wafer. The material 22 of the exit window has a shape and thickness such that it can withstand a pressure differential of at least 14.7 psi and is transmissive to the desirable energy band. A vacuum is created within the beamline such that there is a pressure differential of at least 14.7 psi between the beamline and the exposure chamber containing the wafer. Next, the X-ray beam is scanned between first and second positions 56, 58 such that the X-ray beam passes through the exit window 14 and is incident on the exposure field 31 between first and second edges 57, 59 thereof. The X-ray beam as passed through the exit window 14 has X-rays above and below the desired energy band substantially attenuated due to the thickness of the material 22 of the exit window 14.

Figure 7:
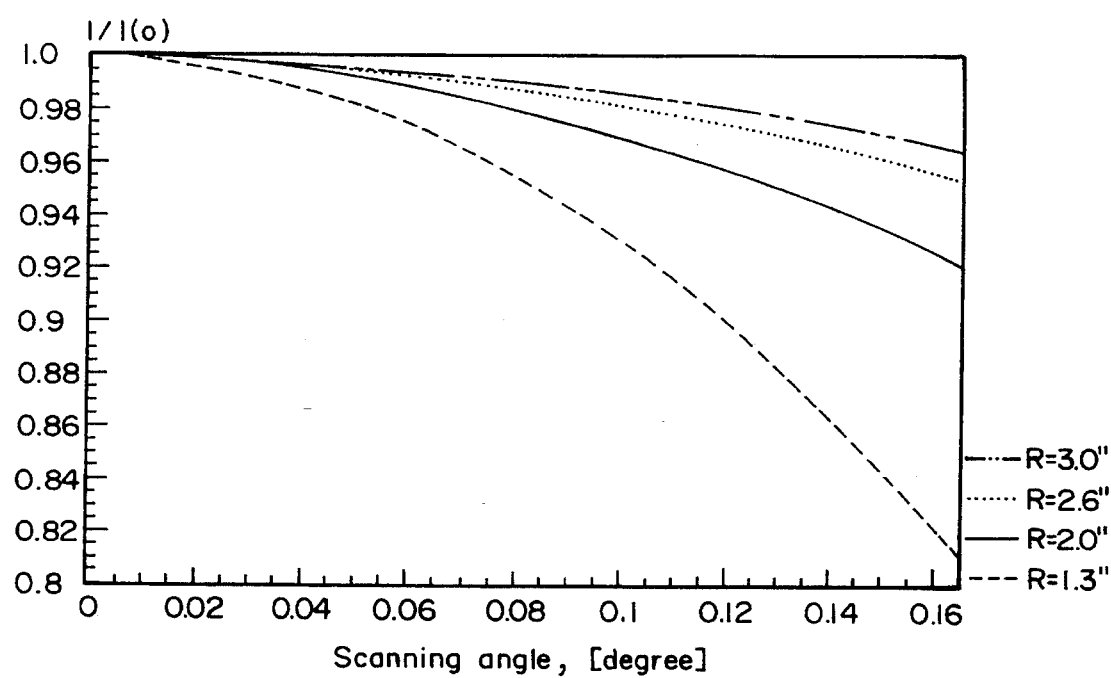
FIG. 7 is a graph of a relative power transmission variation as a function of the deflection angle over one half the scanned field for an X-ray lithography beamline utilizing a 25 micron thick beryllium window in accordance with the present invention.

The beam power transmission variation generated by the beam deflection as a result of the shape of the exit window must be considered. As shown in FIG. 2, as the beam scans between first and second positions 56, 58 the beam only contacts the curved surface 60 having a substantially constant surface radius R. The scanned beam approaches the curved surface 60 of middle section 34 at various angles and thus passes through increasing thickness of material 22 as it moves away from the center line 62 (zero deflection) towards the top and bottom of the window. This virtual thickness is a function of the material thickness, the curvature of the surface 60 and the deflection angle "d". Referring now to FIG. 7, there is shown a graph of the relative beam power transmission variation over one half of the scanned field. It is clear from the graph that a window with a large surface radius R and a small deflection angle are desirable to minimize the virtual thickness and the accompanied beam power transmission variations. For example, FIG. 7 shows the beam power as a function of the scanning angle for three different values of R ranging from 1.3 inches to 3.0 inches. As shown in FIG. 7, an exit window with a surface radius $R \geq 2$ inches would provide the required at least 95% power uniformity at the indicated 0.13° beam deflection.

Although shown and described in what we believed to be the most practical and preferred embodiments, it is apparent that departures from the specific methods and designs described and shown will suggest themselves to those skilled in the art and may be made without departing from the spirit and scope of the invention. We, therefore, do not wish to restrict ourselves to the particular constructions described and illustrated, but desire to avail ourselves of all modifications that may fall within the scope of the appended claims.

What is claimed is:

1. An exit window for sealing an X-ray lithography beamline from an exposure chamber comprising:

a frame for mounting the exit window, said frame having an opening;

a thin material having a window section disposed within said opening of said frame, a peripheral section integral with said window section which extends within the frame, and a thickness; and said window section having a shape that is substantially concave along its width and substantially linear along its length and tapering to a flat surface at said peripheral section such that said thin material can withstand a pressure differential between said X-ray lithography beamline and said exposure chamber of at least 14.7 psi.

2. The exit window of claim 1 wherein said opening of said frame has a rectangular shape having a length of 50 mm and a width of 25 mm.

3. The exit window of claim 2 wherein said peripheral section of said thin material has a length of 120 mm and a width of 42 mm.

4. The exit window of claim 1 wherein said thin material has a predetermined thickness to attenuate X-rays above and below a desired energy band.

5. The exit window of claim 1 wherein said thin material is formed of beryllium having a thickness of between 16 and 25 microns.

6. The exit window of claim 4 wherein said desired energy band is between 800 and 1800 eV.

7. The exit window of claim 4 wherein a radius of curvature of said window section is greater than two inches.

8. The exit window of claim 1 wherein the opening in said frame is equal to or larger than an exposure field on a wafer disposed in the exposure chamber to provide a stationary exit window.

9. The exit window of claim 1 wherein the opening in said frame is slightly larger than a cross-sectional area of an X-ray beam emitted from the X-ray beamline to allow the exit window to be stationary relative to the X-ray beam.

10. The exit window of claim 1 wherein said frame comprises first and second members each having said opening and an integral shoulder extending perpendicularly from one end thereof, said thin material being sandwiched between said first and second members.

11. The exit window of claim 10 wherein said thin material is fastened between said first and second frame members by two pins located at opposite ends of said shoulders of first and second frame members.

12. The exit window of claim 11 further including a seal means disposed within said first frame member completely surrounding said opening and abutting said thin material sandwiched between said first and second frame members.

13. An exit window for sealing an X-ray lithography beamline from an exposure chamber comprising:

a frame for mounting the exit window, said frame having an opening; and a thin material mounted within said opening, said thin material having a radius of curvature along predetermined portions of its length and widths converging to a flat surface along its edges and a thickness to withstand a pressure differential between said X-ray lithography beamline and said exposure chamber of at least 14.7 psi, wherein an X-ray beam emitted from the beamline and passed through the thin material has X-rays above and below a predetermined energy band substantially attenuated.

14. The exit window of claim 13 wherein said thin material has a window section disposed within said opening of said frame and a peripheral section which is integral with said window section and extends within the frame.

15. The exit window of claim 14 wherein said opening of said frame has a rectangular shape having a length of 50 mm and a width of 25 mm.

16. The exit window of claim 15 wherein said peripheral section of said thin material has a length of 120 mm and a width of 42 mm.

17. The exit window of claim 13 wherein said thin material is formed of beryllium having a thickness of between 16 and 25 microns.

18. The exit window of claim 13 wherein the opening in said frame is equal to an exposure field on a wafer disposed in the exposure chamber to provide a stationary exit window.

19. A method of scanning an X-ray beam emitted from an X-ray lithography beamline onto an exposure field on a wafer comprising the steps of:

positioning a stationary exit window having an opening that is approximately equal to the exposure field between said X-ray lithography beamline and said wafer, said opening having a thin material mounted therein, said thin material having a radius of curvative along predetermined portions of its length and width, converging to a flat surface along its edges and a thickness that can withstand a pressure differential of at least 14.7 psi;

drawing a vacuum within said lithography beamline such that there is a pressure differential of at least 14.7 psi between the X-ray lithography beamline and an exposure chamber containing the wafer;

scanning the X-ray beam between first and second positions such that the X-ray beam passes through the exit window and is incident on the wafer between first and second edges of the exposure field;

attenuating X-rays emitted from the X-ray beam as passed through the exit window above and below a predetermined energy band.

* * * * *